United States Patent
Zhou

(10) Patent No.: US 11,950,400 B2
(45) Date of Patent: Apr. 2, 2024

(54) SEMICONDUCTOR DEVICE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 17/644,778

(22) Filed: Dec. 16, 2021

(65) Prior Publication Data

US 2022/0115386 A1    Apr. 14, 2022

Related U.S. Application Data

(62) Division of application No. 16/555,031, filed on Aug. 29, 2019, now Pat. No. 11,233,061.

(30) Foreign Application Priority Data

Aug. 29, 2018  (CN) .......................... 201810992051.5

(51) Int. Cl.
*H10B 10/00* (2023.01)
*H01L 27/092* (2006.01)
(Continued)

(52) U.S. Cl.
CPC ......... *H10B 10/12* (2023.02); *H01L 27/0924* (2013.01); *H01L 29/0847* (2013.01); *H01L 29/66795* (2013.01); *H01L 29/785* (2013.01)

(58) Field of Classification Search
CPC ............. H01L 27/1104; H01L 27/0924; H01L 29/0847; H01L 21/823431; H01L 27/0207;
(Continued)

(56) References Cited

U.S. PATENT DOCUMENTS

| 2017/0178954 | A1 | 6/2017 | Wu et al. |
| 2019/0123162 | A1 | 4/2019 | Xie et al. |
| 2019/0385946 | A1* | 12/2019 | Xie ..................... H01L 27/0886 |

FOREIGN PATENT DOCUMENTS

CN          106469683 A        3/2017

* cited by examiner

*Primary Examiner* — Mohammad A Rahman
(74) *Attorney, Agent, or Firm* — Anova Law Group, PLLC

(57) ABSTRACT

A semiconductor device is provided. The semiconductor device includes: a substrate and first gate structures and source/drain doped layers on the substrate. Each of the source/drain doped layers is located at two sides of one first gate structure. The semiconductor device further includes a dielectric layer on the substrate. The dielectric layer contains first grooves, exposing the source/drain doped layers, wherein each first groove includes a first-groove bottom part and a first-groove top part located above the first-groove bottom part, and a size of the first-groove top part is larger than a size of the first-groove bottom part. The semiconductor device further includes a first conductive structure located in the first-groove bottom part, an insulating layer located in the first-groove top part and on the first conductive structure, and a second conductive structure located in the dielectric layer and connected to the first gate structure.

11 Claims, 9 Drawing Sheets

(51) Int. Cl.
*H01L 29/08* (2006.01)
*H01L 29/78* (2006.01)
*H01L 29/66* (2006.01)

(58) Field of Classification Search
CPC ......... H01L 21/823418; H01L 29/6659; H01L 29/41725; H01L 29/66598; H01L 21/823443; H01L 29/66477; H01L 29/4236; H01L 21/02425; H01L 21/76883; H01L 21/76877; H01L 29/7845; H01L 21/823821; H01L 21/845; H01L 27/0886; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365
See application file for complete search history.

(12) United States Patent
US 11,950,400 B2

SEMICONDUCTOR DEVICE AND FORMING METHOD THEREOF

CROSS-REFERENCES TO RELATED APPLICATIONS

This application is a divisional of U.S. patent application Ser. No. 16/555,031, filed on Aug. 29, 2019, which claims priority of Chinese Patent Application No. 201810992051.5, filed on Aug. 29, 2018, the entire content of which is hereby incorporated by reference.

FIELD OF THE DISCLOSURE

The present disclosure generally relates to the field of semiconductor manufacturing and, more particularly, relates to semiconductor devices and forming techniques thereof.

BACKGROUND

With continuous development of semiconductor technology, semiconductor memory presents a trend of high integration, high speed, and low power consumption. Functionally, semiconductor memory may be classified into random access memory (RAM) and read only memory (ROM). When random access memory is in operation, data may be read from any specified addresses at any time, and data may be written to any specified storage units at any time. Random access memory may be easily read and written, and flexible in use.

Random access memory may be classified into static random-access memory (SRAM) and dynamic random-access memory (DRAM). Static random-access memory uses a trigger with positive feedback to achieve data storage, mainly relying on continuous power supply to maintain data integrity. Static random-access memory does not need to be refreshed during use. Static random-access memory has been widely used in high-speed caching and frequent data processing of computers.

However, electrical performance of conventional static random-access memory are still undesirable. The disclosed methods and structures are directed to solve one or more problems set forth above and other problems in the art.

BRIEF SUMMARY OF THE DISCLOSURE

One aspect of the present disclosure includes a method of forming a semiconductor device. A substrate is provided, and first gate structures and source/drain doped layers are formed on the substrate. A dielectric layer is formed on the substrate, covering the first gate structures and source/drain doped layers. A first groove is formed in the dielectric layer exposing the source/drain doped layer. The first groove includes a first-groove bottom part and a first-groove top part. The first-groove top part is larger than the first-groove bottom part, and a sidewall of the first-groove top part is recessed more into the dielectric layer with respect to a sidewall of the first-groove bottom part. A first conductive structure is formed in the first-groove bottom part, and an insulating layer is formed in the first-groove top part. A second conductive structure is formed in the dielectric layer, and the second conductive structure is connected to the first gate structure.

Another aspect of the present disclosure includes a semiconductor device. The semiconductor device includes a substrate, and first gate structures and source/drain doped layers on the substrate. Each of the source/drain doped layers is located at two sides of one first gate structure. The semiconductor device also includes a dielectric layer on the substrate. The dielectric layer covers the first gate structures and the source/drain doped layers. The dielectric layer contains first grooves, exposing the source/drain doped layers. Each first groove includes a first-groove bottom part and a first-groove top part located above the first-groove bottom part, and a size of the first-groove top part is larger than a size of the first-groove bottom part. The semiconductor device also includes a first conductive structure located in the first-groove bottom part, and an insulating layer located in the first-groove top part and on the first conductive structure. The insulating layer and the dielectric layer are made of different materials. The semiconductor device also includes a second conductive structure located in the dielectric layer and connected to the first gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

Figure 1:
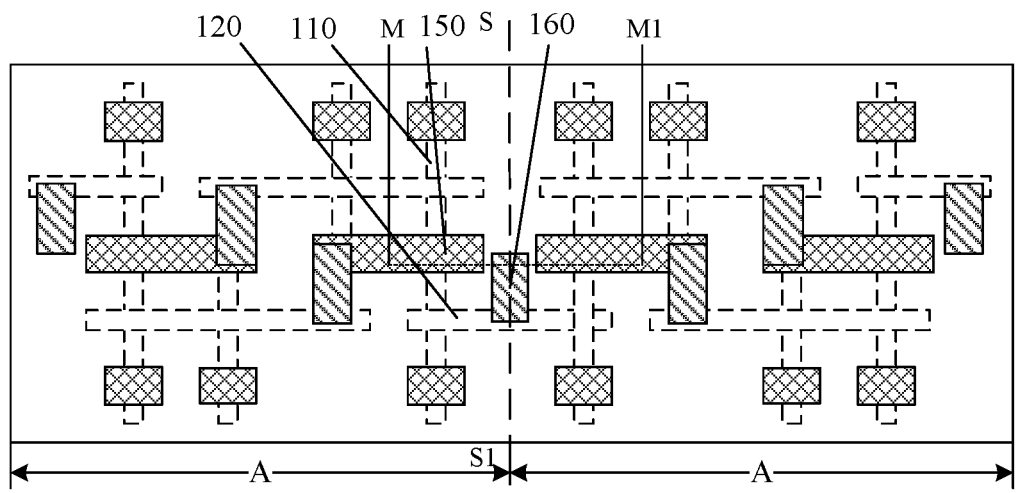
FIGS. 1 to 2 illustrate structures of a static random-access memory (SRAM) device.
Figure 2:
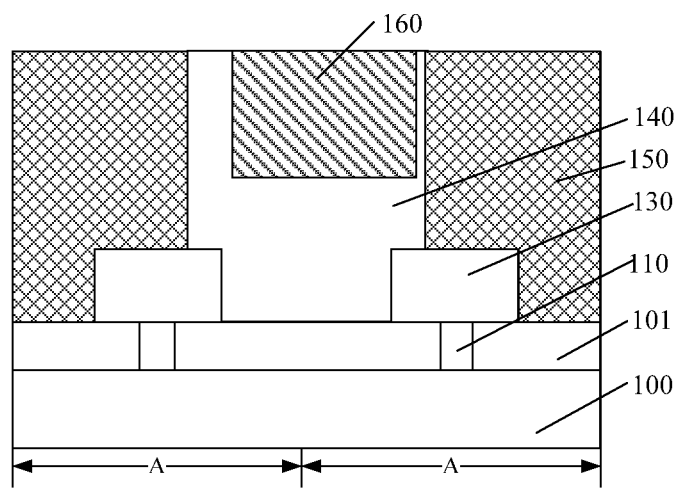

FIGS. 1 to 2 illustrate structures of a static random-access memory (SRAM) device. FIG. 1 is a top view of the SRAM device, and FIG. 2 is a sectional view along cutting line M-M1 in FIG. 1. The SRAM device includes a substrate 100 including adjacent device regions A. The adjacent device regions A are mirror-connected along axis S-S1. A surface of the substrate 100 at the device region A has fins 110 and an isolation layer 101. The isolation layer 101 covers a portion of a sidewall of the fins 110, and the fins 110 at the adjacent device regions A are adjacent. The SRAM device also includes a gate structure 120 spanning adjacent fins 110 at the adjacent device regions A, and source/drain doped layers 130 in the fins 110 at two sides of the gate structure 120 at the device regions A. At least one source/drain doped layer 130 in a device region A is adjacent to a source/drain doped layer 130 in an adjacent device region A. The SRAM device also includes a dielectric layer 140 on the substrate. The dielectric layer 140 covers a top surface of the source/drain doped layer 130 and a top surface and a sidewall surface of the gate structure 120. The SRAM device also includes a first conductive structure 150 and a second conductive structure 160 in the dielectric layer 140. The first conductive structure 150 spans the source/drain doped layer 130 and covers a portion of a top surface and a sidewall surface of the source/drain doped layer 130. The second conductive structure 160 covers a portion of a top surface of the gate structure 120.

In the above SRAM device, the first conductive structure may be used to connect a first metal interconnect layer and the source/drain doped layer, and the second conductive structure may be used to connect the first metal interconnect layer and the gate structure. The second conductive structure is formed after the first conductive structure is formed. In a forming process of the second conductive structure, a photolithography process may be used to form a recess. Because of a limited precision of the photolithography process, a position of the recess may be deviated, and distances between the recess and two adjacent first conductive structures 150 may be unequal. If the dielectric layer between the second conductive structure 160 and the first conductive structure 150 is thin, electrical leakage may occur. Especially, when the recess is severely offset, bridging between the first conductive structure 150 and the second conductive structure 160 may occur, resulting in poor performance of a formed semiconductor device.

The present disclosure provides a method of forming a semiconductor device. A first groove is formed in a dielectric layer, and the first groove includes a first-groove top part and a first-groove bottom part. A size of the first-groove top part is larger than a size of the first-groove bottom part, and a sidewall of the first-groove top part is recessed more into the dielectric layer with respect to a sidewall of the first-groove bottom portion. A first conductive structure is formed the in first-groove bottom part, and a second conductive structure is formed in the dielectric layer between the first grooves.

A minimum distance between the first conductive structure and the second conductive structure in the dielectric layer is a minimum distance between a sidewall of the first-groove top part and a sidewall of the first-groove bottom part. By adjusting the minimum distance between the sidewall of the first-groove top part and the sidewall of the first-groove bottom part, electrical leakage between the first conductive structure and the second conductive structure may be prevented. Meanwhile, an insulating layer is formed in the first-groove top part, and the insulating layer covers a surface of the first conductive structure. Accordingly, short-circuiting between the first conductive structure and the second conductive structure may be prevented, and performance of the semiconductor device may be improved.

Figure 3:
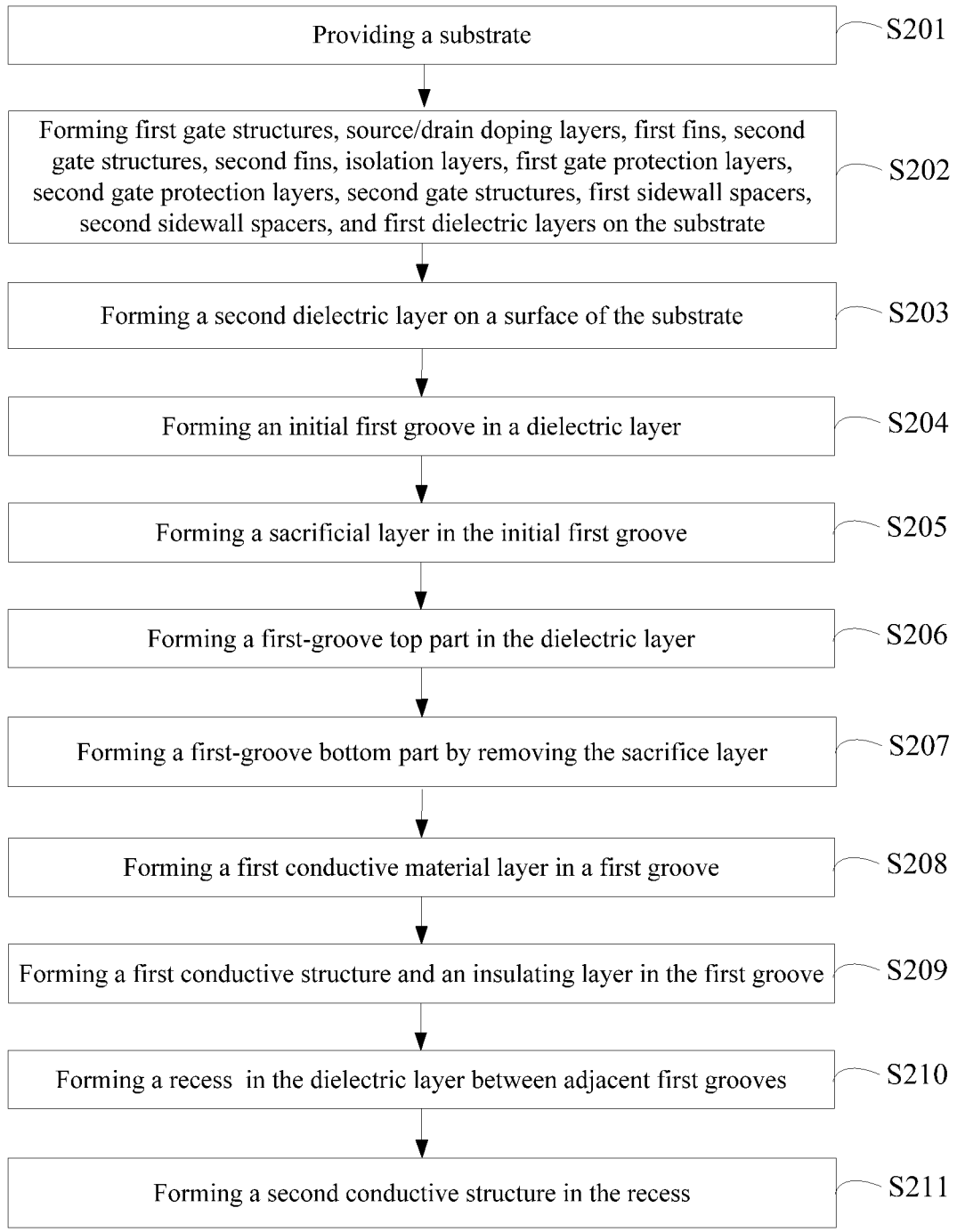
FIG. 3 illustrates an exemplary forming process of a semiconductor device consistent with the disclosed embodiments.

FIG. 3 illustrates an exemplary forming process of a semiconductor device consistent with the disclosed embodiments. FIGS. 4 to 16 illustrate semiconductor structures corresponding to certain stages of the exemplary forming process of a semiconductor device.

Figure 4:
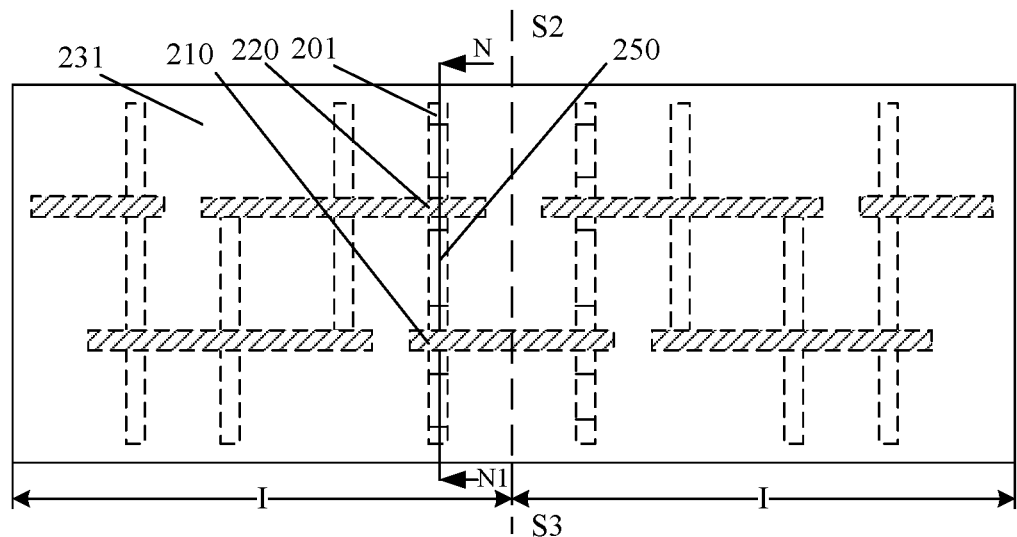
FIGS. 4 to 16 illustrate semiconductor structures corresponding to certain stages of the exemplary forming process of a semiconductor device consistent with the disclosed embodiments.
Figure 5:
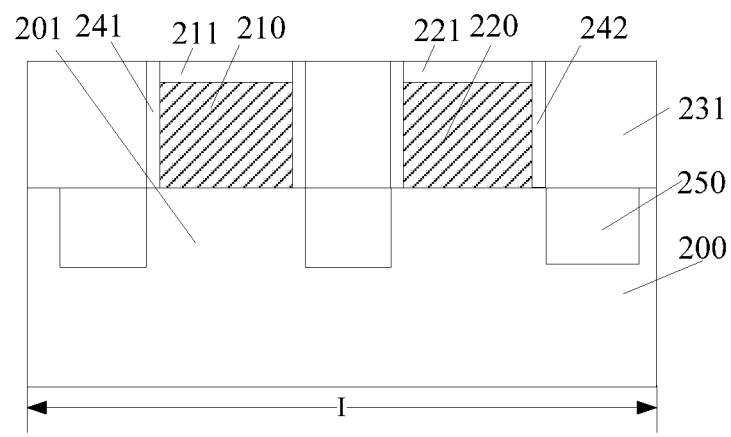

As shown in FIG. 3, at the beginning of the forming process, a substrate is provided (S201). FIG. 4 is a top view of the semiconductor device, and FIG. 5 is a sectional view along cutting line N-N1 in FIG. 4. As shown in FIG. 4 and FIG. 5, a substrate 200 is provided. The substrate 200 may be made of a semiconductor material including silicon, germanium, silicon germanium, gallium arsenide, indium gallium arsenide, etc. The silicon includes monocrystalline silicon, polycrystalline silicon or amorphous silicon. The substrate 200 may also be a semiconductor-on-insulator structure including an insulator and a semiconductor material layer on the insulator. The semiconductor material layer may be made of a semiconductor material including silicon, germanium, silicon germanium, gallium arsenide, indium gallium arsenide, etc.

In one embodiment, the substrate 200 is made of monocrystalline silicon.

In one embodiment, the substrate 200 includes adjacent device regions I. Only two adjacent device regions I of the semiconductor device are shown in FIG. 4. The two adjacent device regions I are mirror-distributed along axis S2-S3 in FIG. 4.

In one embodiment, the device regions I may be used to form static random-access memory. In some other embodiments, the device regions I may be used to form PMOS transistors or NMOS transistors.

Returning to FIG. 3, after the substrate is provide, first gate structures, source/drain doped layers, first fins, second gate structures, second fins, isolation layers, first gate protection layers, second gate protection layers, second gate structures, first sidewall spacers, second sidewall spacers, and first dielectric layers may be formed on the substrate (S202).

As shown in FIG. 4 and FIG. 5, first gate structures and source/drain doped layers are formed on the substrate, and the source/drain doped layers are located at two sides of the first gate structure.

In one embodiment, first gate structures 210 and source/drain doped layers 250 are formed on the substrate 200 at the device regions I.

In one embodiment, the substrate 200 at the device regions I is disposed with first fins 201, and the first fins 201 of adjacent device regions I are adjacent to each other. The first gate structure 210 spans adjacent first fins 201 at the adjacent device region I and covers a portion of top surfaces and sidewall surfaces of the adjacent first fins 201. The source/drain doped layers 250 are in the first fins at two sides of the first gate structures 210 at the device regions I. At least one source/drain doped layer 250 in a device region I is adjacent to source/drain doped layers 250 in an adjacent device region I.

In one embodiment, second gate structures 220 are formed at the device regions I of the substrate 200. The second gate structure 220 spans the first fin 201 and covers a portion of the top surface and sidewall surface of the first fin 201. The source/drain doped layers 250 are also located in the first fins 201 at two sides of the second gate structure 220.

In one embodiment, the first fin 201 may serve as a fin of a transfer transistor and a pull-down transistor.

In one embodiment, second fins are formed on a surface of the substrate 200 at two sides of the first fins 201 at adjacent device regions I. The second gate structure 220 spans the first fins 201 and the second fins, and covers a portion of top surface and sidewall surface of the second fins. The second fin may serve as a fin of a pull-up transistor.

In some other embodiments, the second fin may serve as a fin of another transistor, which may be an NMOS transistor or a PMOS transistor.

In one embodiment, the first fins 201 and the second fins are formed by patterning the substrate 200. In some other embodiments, a first fin material layer may be formed on the substrate 200, and then the first fin material layer may be patterned to form first fins 201 and second fins.

In one embodiment, the first fins 201 are made of monocrystalline silicon. In some other embodiments, the first fins 201 may be made of monocrystalline silicon germanium or other semiconductor material.

In one embodiment, isolation layers 202 are formed on the substrate 200. The isolation layers 202 cover a portion of the sidewall surfaces of the first fins 201. The isolation layers 202 are made of a material including silicon oxide.

In one embodiment, each of the first gate structures 210 and the second gate structures 220 includes a gate dielectric layer and a gate layer on the gate dielectric layer. The gate dielectric layer is made of a high K (K greater than 3.9) dielectric material, and the gate layer is made of metal such as tungsten.

First gate protection layers 211 are formed on top of the first gate structures 210, and second gate protection layers 221 are formed on top of the second gate structures 220.

In one embodiment, a dielectric layer 230 includes a first interlayer dielectric layer 231 and a second interlayer dielectric layer 232. The first dielectric layer 231 covers sidewalls of the first gate structure 210 and the second gate structure 220. The second dielectric layer 232 covers top surfaces of the first gate structure 210 and the second gate structure 220.

A method of forming the first gate structure 210 includes forming a first dummy gate structure on the substrate 200 at the device regions I. The first dummy gate structure extends from one device region to its adjacent device region, and spans first fins 201 at two adjacent device regions I. The method also includes forming a first dielectric layer 231 covering the substrate 200, the top and sidewall of the first fin 201, and sidewall of the dummy first gate structure. The dielectric layer 231 extends from a device region I to its adjacent device region I. After the first dielectric layer 231 is formed, the first dummy gate structure is removed, and a first gate opening is formed in the first dielectric layer 231. The first gate structure 210 is then formed in the first gate opening.

In one embodiment, a second gate structure 220 is formed in a forming process of the first gate structure 210. A method of forming the second gate structure 220 includes forming a second dummy gate structure on the substrate 200 at the device region I. The second dummy gate structure spans the first fin 201 at the device region I. The method also includes removing the second dummy gate structure after the first dielectric layer 231 is formed, thus forming a second gate opening in the first dielectric layer 231. The second gate structure 220 is then formed in the second gate opening.

In one embodiment, a first sidewall spacer 241 and a second sidewall spacer 242 are formed. The first sidewall spacer 241 is located on a sidewall of the first gate structure 210, and the second sidewall spacer 242 is located on a sidewall of the second gate structure 220. A top surface of the first gate structure 220 is flush with a top surface of the first sidewall spacer 241, and a top surface of the second gate structure 220 is flush with a top surface of the second sidewall spacer 242. The first interlayer dielectric layer 231 covers sidewalls of the first sidewall spacer 241 and sidewalls of the second spacer 242. The second interlayer dielectric layer 232 is also located on the first sidewall spacer 241 and the second sidewall spacer 242.

In one embodiment, before the first dielectric layer 231 is formed, source/drain doped layers 250 are formed in the first fins 201 at two sides of the first dummy gate structure and the second dummy gate structure. A method of forming the source/drain doped layer 250 includes forming a notch in the first fins 201 respectively at two sides of the first dummy gate structure and the second dummy gate structure. The source/drain doped layers 250 are then epitaxially formed in the notches.

In one embodiment, the first gate structure 210 and the second gate structure 220 share a same source/drain. In some other embodiments, the first gate structure and the second gate structure may not share a same source/drain.

In one embodiment, the source/drain doped layers 250 are formed using an ion implantation process.

In some other embodiments, a first gate structure 210 spanning the first fin 201 is formed on the substrate 200. After the first gate structure 210 is formed, the source/drain doped layers 250 are formed in the first fins 201 at two sides of the first gate structure 210.

Returning to FIG. 3, after forming the first gate structures, the source/drain doped layers, the first fins, the second gate structures, the second fins, the isolation layers, the first gate protection layers, the second gate protection layers, the second gate structures, the first sidewall spacers, the second sidewall spacers, and the first dielectric layers, a second dielectric layer may be formed on the surface of the substrate (S203).

Figure 6:
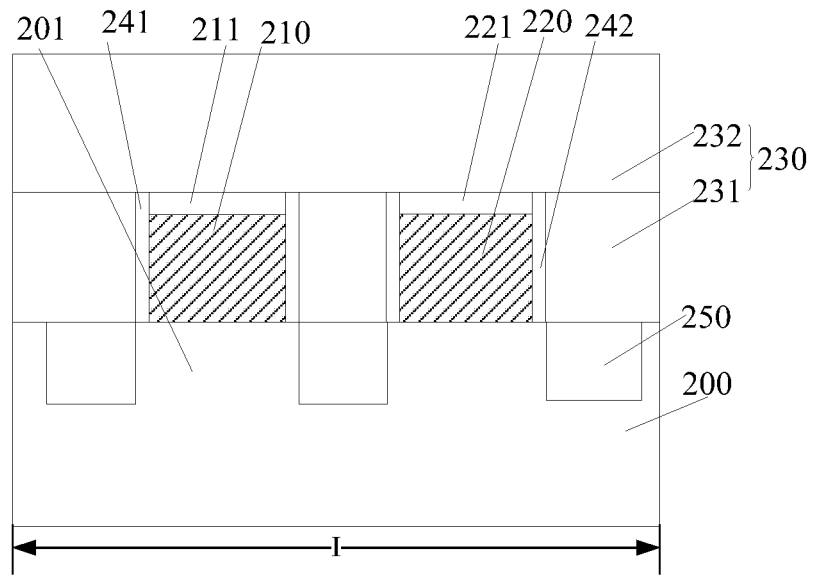

As shown in FIG. 6, a second dielectric layer 232 is formed on the surface of the substrate 200. The second dielectric layer 232 may be used for interlayer isolation. The second dielectric layer 232 covers a surface of the isolation layer 202, the surface of the first fin 201, the top surface of the first gate structure 210, the top surface of the second gate structure 220, and the top surface and sidewall surface of the source/drain doped layer 250.

The second dielectric layer 232 is made of a material including silicon oxide, silicon nitride, silicon borohydride, nitrogen silicon oxycarbide or silicon oxynitride.

A first groove is formed in the dielectric layer, exposing the source/drain doped layer. The first groove includes a first-groove bottom part and a first-groove top part above the first-groove bottom part. A size of the first-groove top part is greater than a size of the first-groove bottom part. A sidewall of the first-groove top part is recessed more into the dielectric layer with respect to a sidewall of the first-groove bottom part. FIGS. 7 to 12 illustrate a method of forming the first groove.

Figure 7:
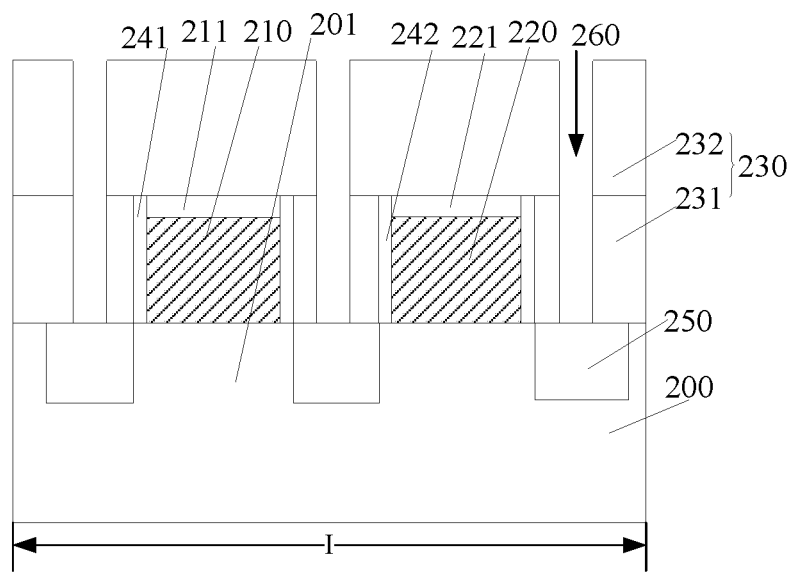

Returning to FIG. 3, after forming the second dielectric layer, an initial first groove may be formed in the dielectric layer (S204). As shown in FIG. 7, an initial first groove 260 is formed in dielectric layer 230, exposing the source/drain doped layer 250. The initial first groove 260 exposes a portion of top surface and sidewall surface of the source/drain doped layer 250. The initial first groove 260 is a transition state for subsequently forming a first groove.

The initial first groove 260 extends through the first dielectric layer 231 and the second dielectric layer 232. A size of the initial first groove 260 is consistent with the size of the first-groove bottom part 262 of the subsequently formed first groove. A depth of the initial first groove 260 is same as a depth of the subsequently formed first groove.

Figure 8:
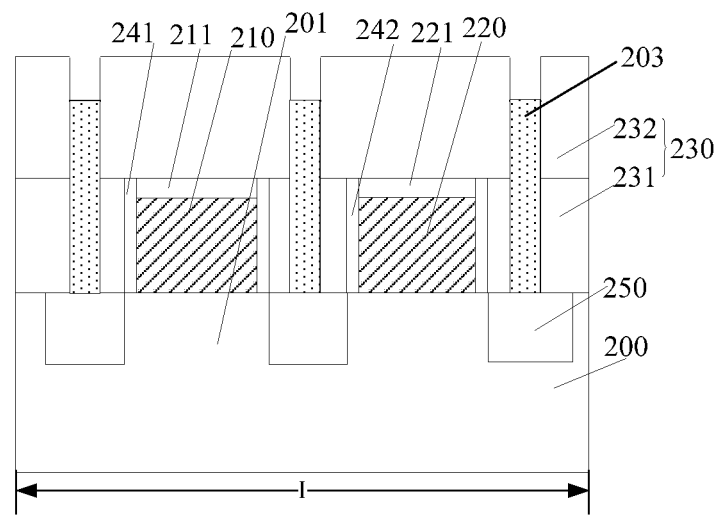

Returning to FIG. 3, after forming the initial first groove, a sacrificial layer may be formed in the initial first groove (S205). As shown in FIG. 8, a sacrificial layer 203 is formed in the initial first groove 260. A top surface of the sacrificial layer 203 is lower than a top surface of the dielectric layer 230. Specifically, the top surface of the sacrificial layer 203 is lower than a top surface of the second dielectric layer 232. The sacrificial layer 203 protects the source/drain doped layer 250 in forming the first-groove top part.

A method of forming the sacrificial layer 203 includes forming an initial sacrificial material layer (not shown) in the initial first groove 260 and on a surface of the dielectric layer 230. The method also includes planarizing the initial sacrificial material layer until the top surface of the dielectric layer 230 is exposed, thus forming an initial sacrificial layer (not shown) in the initial first groove 260. The method also includes etching back the initial sacrificial layer to remove a portion of the initial sacrificial layer, thus forming the sacrificial layer 203.

The sacrificial layer 203 is made of a material including an organic material. In one embodiment, the sacrificial layer 203 is made of an organic dielectric layer (ODL) material, and the initial sacrificial material layer is formed by a spin coating process. In some other embodiments, the sacrificial layer 203 may be made of a bottom anti-reflective coating (BARC) material or a deep UV light absorbing oxide (DUO) material. The DUO material may be a siloxane polymer material, including $CH_3$—SiOX, Si—OH, or $SiOH_3$.

A distance between a top surface of the sacrificial layer 203 and a top surface of the dielectric layer 230 may determine a depth of a top part of a subsequently formed first groove.

Figure 9:
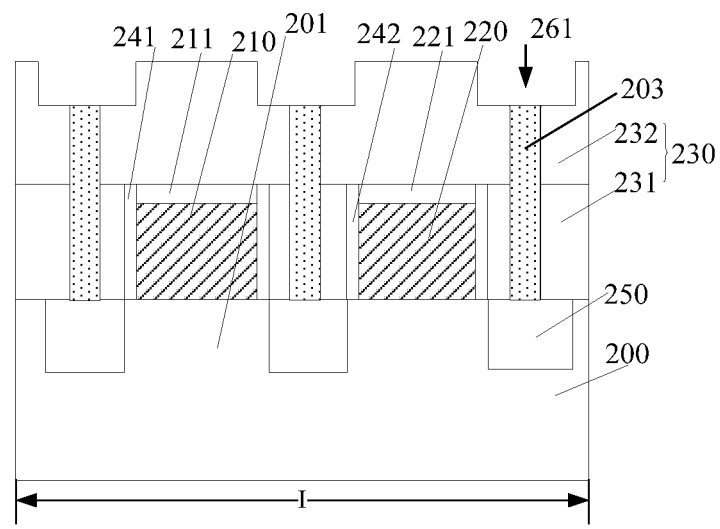

Returning to FIG. 3, after forming the sacrificial layer, a first-groove top part may be formed in the dielectric layer (S206). As shown in FIG. 9, a portion of the dielectric layer 230 at two sides of the initial first groove 260 is removed, and a first groove top part 261 is thus formed in the dielectric layer 230.

A method of removing a portion of the dielectric layer 230 around the initial first groove 260 includes forming a first mask layer (not shown) on the surface of the dielectric layer 230. The first mask layer exposes a portion of the surface of the dielectric layer 230 at two sides of the initial first groove 260. The method also includes etching the dielectric layer 230 at two sides of the initial first groove 260 exposed by the first mask layer by using the first mask layer as a mask, thus forming a first-groove top part 261. A bottom surface of the first-groove top part 261 is flush with the top surface of the sacrificial layer 203.

Figure 10:
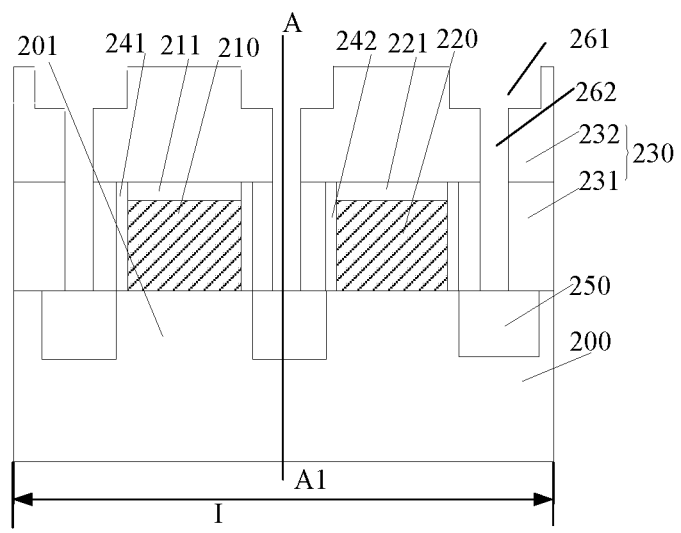
Figure 11:
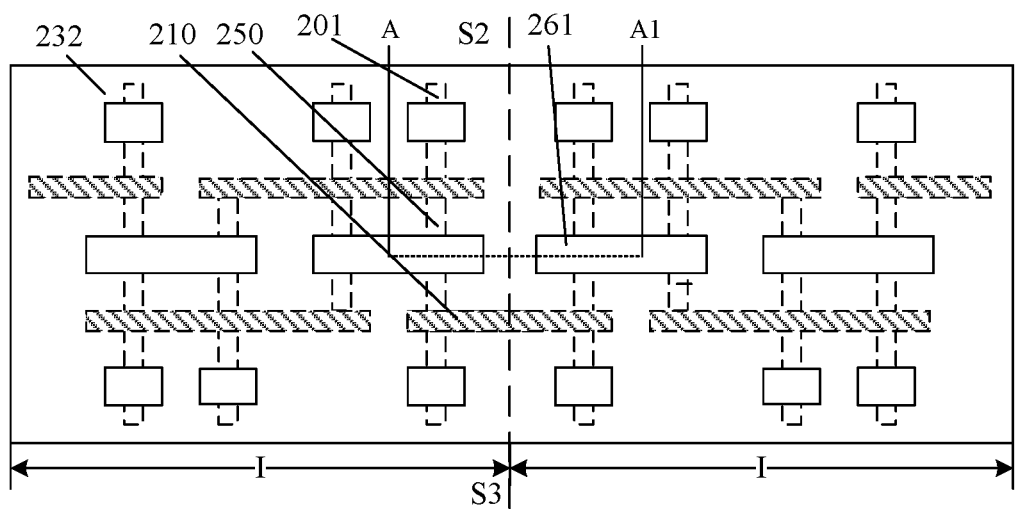
Figure 12:
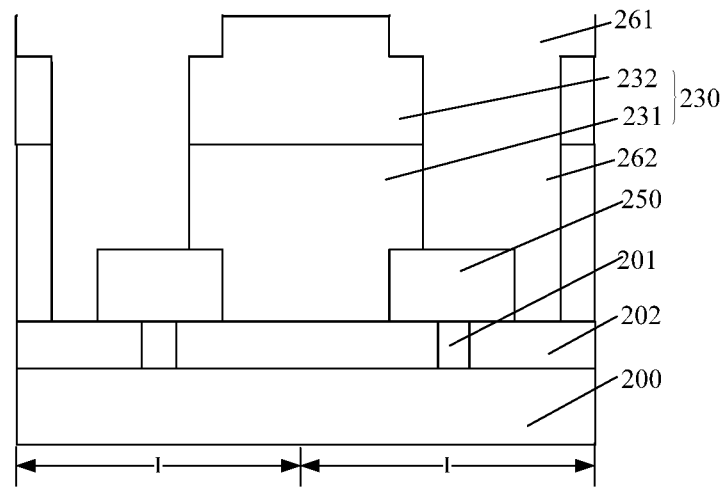

Returning to FIG. 3, after forming the first-groove top part, a first-groove bottom part may be formed by removing the sacrifice layer (S207). The first-groove bottom part 262 may be formed during formation of the first-groove top part 261. FIG. 10, FIG. 11 and FIG. 12 illustrate the semiconductor structure after the first-groove bottom part 262 is formed. FIG. 11 is a top view of the semiconductor structure illustrated in FIG. 10, and FIG. 12 is a sectional view along cutting line A-Al in FIG. 11. After the first-groove top part 261 is formed, the sacrifice layer is removed, and a first-groove bottom part 262 is thus formed. The first-groove bottom part 262 exposes the source/drain doped layer 250.

The first-groove top part 261 and the first-groove bottom part 262 together form the first groove. A size of the first-groove top part 261 is larger than a size of the first-groove bottom part 262, and a sidewall of the first-groove top part 261 is recessed more into the dielectric layer with respect to a sidewall of the first-groove bottom part 262.

A difference between the size of the first-groove top part 261 and the size of the first-groove bottom part 262 is in a range of approximately 5 nm to 20 nm. A distance between a sidewall of the first-groove top part and a sidewall of the first-groove bottom part is in a range of approximately 2.5 nm to 20 nm, for example, approximately 2.5 nm to 10 nm.

The difference between the size of the first-groove top part 261 and the size of the first-groove bottom part 262 determines the distance between the sidewall of the first-groove top part and the sidewall of the first-groove bottom part at a same side.

The minimum distance between the sidewall of the first-groove top part and the sidewall of the first-groove bottom part at a same side determines a minimum thickness of the dielectric layer between a first conductive structure and a second conductive structure subsequently formed.

In the semiconductor structure, a size between adjacent first-groove bottom parts is fixed. If the difference between the size of the first-groove top part 261 and the size of the first-groove bottom part 262 is large, the size of the first-groove top part 261 may be large, and the size of the dielectric layer between adjacent first grooves may be small. Accordingly, a size of the second conductive structure located in the dielectric layer between adjacent first grooves may be small, and performance of the formed semiconductor device may be undesirable.

If the difference between the size of the first-groove top part 261 and the size of the first-groove bottom part 262 is small, the distance between the sidewall of the first-groove top part and the sidewall of the first-groove bottom part at a same side may be small. Accordingly, the thickness of the dielectric layer between the subsequently formed first conductive structure and second conductive structure may be small. Thus, the dielectric layer between the first conductive structure and the second conductive structure may be broken down, and electrical leakage between the first conductive structure and the second conductive structure may occur.

A ratio of a depth of the first-groove top part 261 to a depth of the first-groove is in a range of approximately 1:4-1:8. The depth of the first-groove top part 261 is in a range of approximately 150 angstroms to 300 angstroms.

In one embodiment, the first-groove bottom part is formed after the first-groove top part is formed.

A method of forming the first groove includes forming a first patterned layer on the dielectric layer. The first patterned layer exposes a portion of the surface of the dielectric layer. The method also includes etching the dielectric layer by using the first patterned layer as a mask, thus forming a first-groove top part in the dielectric layer. The method also includes removing the first patterned layer and forming a second patterned layer on the dielectric layer. The second patterned layer exposes a portion of a surface of the dielectric layer at a bottom of the first-groove top part. The method also includes etching the dielectric layer with the second patterned layer as a mask, thus forming a first-groove bottom part in the dielectric layer. The first-groove bottom part is located at the bottom of the first-groove top part.

In one embodiment, a method of forming the first groove includes forming an initial second groove in the dielectric layer. The dielectric layer at two sides of the initial second groove and the dielectric layer at a bottom of the initial second groove are etched until the source/drain doped layer is exposed, thus forming the first-groove top part and the first-groove bottom part.

An insulating layer may be subsequently formed in the first groove top part 261. A depth of the first-groove top part 261 may determine a thickness of the subsequently formed insulating layer. If the insulating layer is thin, the insulating layer may have a limited insulating effect, and electrical leakage may occur between the first conductive structure and the second conductive structure. If the depth of the first groove top part 261 is large, a height of the first conductive structure may be small, and performance of the formed semiconductor device may be undesirable.

Since the sidewall of the first-groove bottom part 262 is recessed relative to a sidewall of the first-groove top part 261, a minimum distance between the sidewall of the first-groove bottom part 262 and the sidewall of the first-groove top part 261 is greater than zero. A first conductive structure is subsequently formed in the first-groove bottom part 262, and a second conductive structure is subsequently formed in the dielectric layer between the first grooves.

The size of the first-groove top part 261 is greater than the size of the first-groove bottom part 262. The minimum distance between the first conductive structure and the second conductive structure is the minimum distance between the sidewall of the first-groove top part 261 and the sidewall of the first-groove bottom part 262. Thus, a size of the subsequently formed dielectric layer between the first conductive structure and second conductive structures may be greater than zero. Accordingly, the first conductive structure and the second conductive structure may be isolated.

The minimum distance between the first conductive structure and the second conductive structure may be adjusted by controlling the distance between the sidewall of the first-groove top part 261 and the sidewall of the first-groove bottom part 262. Accordingly, the electrical leakage between the first conductive structure and the second conductive structure may be prevented, and thus performance of the semiconductor device may be improved.

A first conductive structure may be formed in the first groove bottom part 262, and the first conductive structure may cover a portion of the surface of the source/drain doped layer 250.

Figure 13:
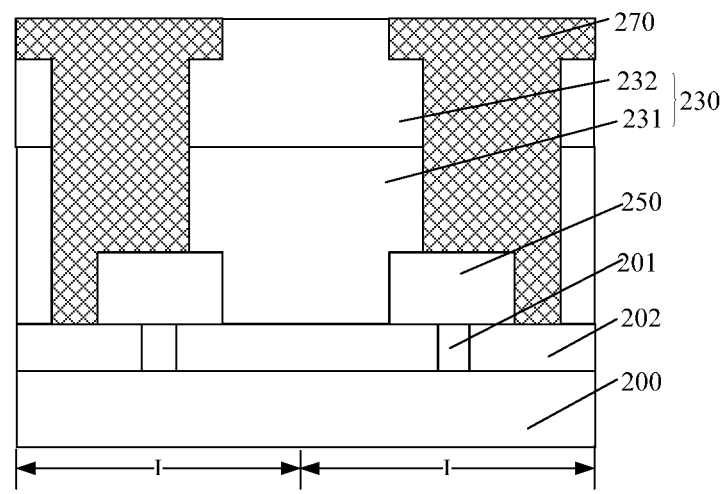

Returning to FIG. 3, after removing the sacrifice layer, a first conductive material layer may be formed in the first groove (S208). As shown in FIG. 13, a first conductive material layer 270 is formed in the first groove. The first conductive material layer 270 fills the first-groove top part 261 and the first-groove bottom part 262. A top surface of the first conductive material layer 270 is flush with the top surface of the dielectric layer 230. The first conductive material layer 270 provides a material for subsequently forming the first conductive structure.

A method of forming the first conductive material layer 270 includes forming an initial first conductive material layer (not shown) in the first groove and on the dielectric layer 230. The method also includes planarizing the initial first conductive material layer until a top surface of the dielectric layer 230 is exposed, thus forming the first conductive material layer in the first groove.

The first conductive material layer 270 is made of metal such as tungsten, cobalt, titanium or nickel. In one embodiment, the first conductive material layer is made of cobalt.

A process of forming the first conductive material layer 270 includes a deposition process such as a chemical vapor deposition process, a physical vapor deposition process, or an atomic layer deposition process.

Before forming the first conductive material layer 270, a metal layer (not shown) may be formed on the surface and the sidewall surface of the source/drain doped layer 250 exposed at the bottom of the first groove. The metal layer may be also located on the dielectric layer 230.

The metal layer is made of a material including Ti, Co or Ni. In one embodiment, the metal layer is made of Ti. A process of forming the metal layer includes a deposition process such as a sputtering process.

After the metal layer is formed, the metal layer and the source/drain doped layer 250 are annealed, and a metal silicide layer (not shown) is formed on the surface of the source/drain doped layer exposed by the first groove.

In one embodiment, a barrier layer (not shown) may be also formed on the surface of the metal layer before the subsequent annealing treatment. The barrier layer is made of a material including titanium nitride or tantalum nitride. A process of forming the barrier layer is a deposition process such as a sputtering process.

In one embodiment, the barrier layer is formed before the annealing treatment. During the annealing treatment, the barrier layer may protect the metal layer, and may prevent the annealing treatment from oxidizing the metal layer.

In some other embodiments, the barrier layer is formed after the annealing treatment. In some other embodiments, no barrier layer is formed.

Figure 14:
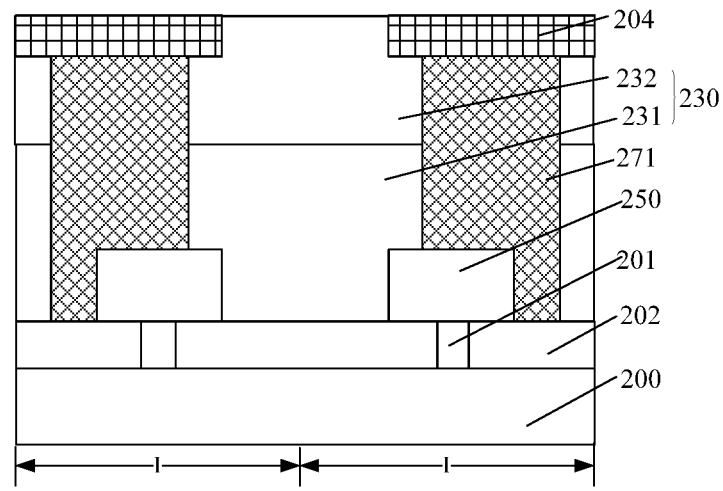

Returning to FIG. 3, after forming the first conductive material layer, a first conductive structure and an insulating layer may be formed in the first groove (S209). As shown in FIG. 14, an insulating layer 204 is formed in the first-groove top part 261. Before forming the insulating layer 204, the first conductive material layer 270 is etched back until the surface of the dielectric layer 230 at the bottom of the first-groove top part 261 is exposed. A first conductive structure 271 is thus formed in the first-groove bottom part 262.

A method of forming the insulating layer 204 includes, after forming the first conductive structure 271, forming an initial insulating layer (not shown) in the first-groove top part 261 and on the surface of the dielectric layer 230. The method also includes planarizing the initial insulating layer until the top surface of the dielectric layer 230 is exposed, thus forming the insulating layer 204 in the first-groove top part 261.

The insulating layer 204 and the dielectric layer are made of different materials. The insulating layer 204 may be used to protect the first conductive structure. The dielectric layer 230 is located between the insulating layers. In a subsequent process of etching the dielectric layer, to avoid consuming the insulating layers 204, the insulating layers 204 and the dielectric layer 230 are required to be made of different materials.

The insulating layer 204 is made of a material including silicon carbide, silicon nitrocarbide, silicon oxycarbide. In one embodiment, the insulating layer 204 is made of silicon carbide.

The insulating layer 204 covers a top surface of the first conductive structure 271 to prevent short-circuiting between the first conductive structure 271 and the subsequently formed second conductive structure. Thus, the insulating layer 204 needs to be made of an insulating material.

After the insulating layer 204 is formed, a second conductive structure may be formed in the dielectric layer 230 between adjacent first grooves. The second conductive structure is connected to the first gate structure 210.

Figure 15:
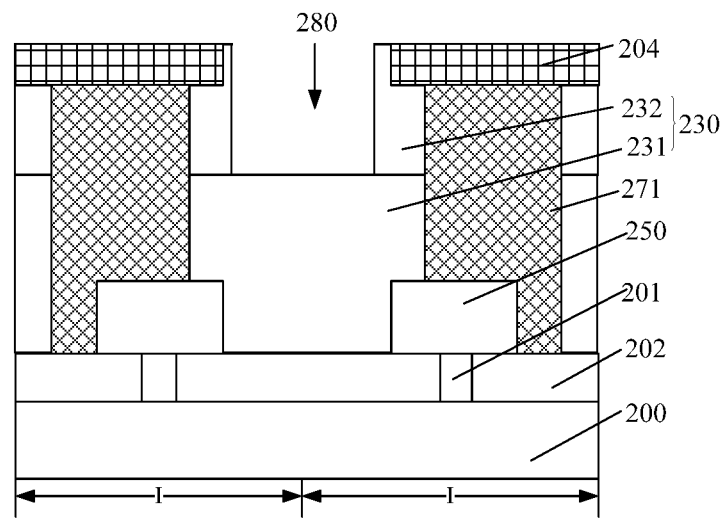

Returning to FIG. 3, after forming the first conductive structure and the insulating layer, a recess may be formed in the dielectric layer between adjacent first grooves (S210). Referring to FIG. 15, after the first conductive structure 271 and the insulating layer 204 are formed, the dielectric layer 230 between adjacent first grooves is etched, forming a recess 280 in the dielectric layer 230 between the adjacent first grooves. The recess 280 exposes a portion of the top surface of the first gate structure 210. The recess 280 may provide space for subsequently forming the second conductive structure.

Specifically, the second dielectric layer 232 between the adjacent first-groove top parts 261 is etched until the top surface of the first gate structure 210 is exposed. The recess 280 is thus formed in the second layer dielectric layer 232 between the adjacent first-groove top parts 261.

A method of forming the recess 280 includes forming a second mask layer (not shown) on the dielectric layer 230. The second mask layer exposes a portion of a surface of the second dielectric layer 232 between adjacent first-groove top parts 261. The second dielectric layer 232 between the adjacent first-groove top parts 261 is then etched by using the second mask layer as a mask, and the recess 280 is thus formed in the second dielectric layer 232 between the adjacent first-groove top parts 261.

Figure 16:
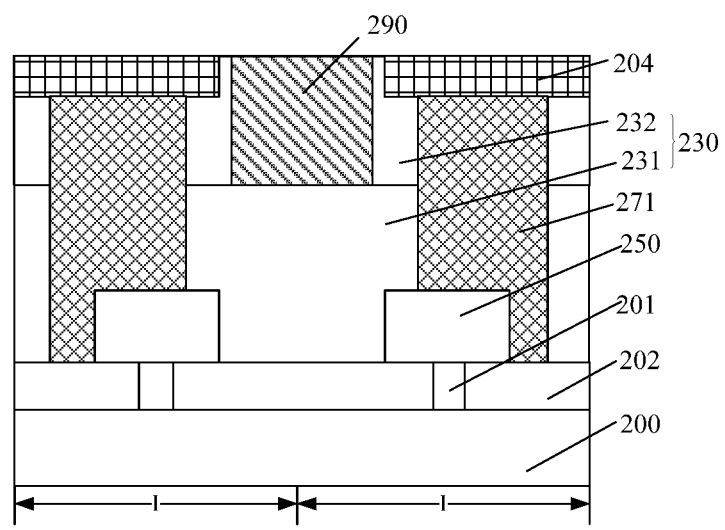

Returning to FIG. 3, after forming the recess in the dielectric layer between the adjacent first grooves, a second conductive structure may be formed in the recess (S211). As shown in FIG. 16, a second conductive structure 290 is formed in the recess 280, and the second conductive structure is connected to the first gate structure. The second conductive structure 290 covers a portion of the top surface and sidewall surface of the first gate structure 210.

Before forming the second conductive structure 290, the first gate protection layer 211 on top of the first gate structure exposed by the recess 280 is removed. The second conductive structure 290 is connected to the gate layer of the first gate structure 210.

A method of forming the second conductive structure 290 includes forming a second conductive material layer (not shown) in the recess 280 and on the dielectric layer 230. The method also includes planarizing the second conductive material layer until the top surface of the dielectric layer 230 is exposed, and the second conductive structure 290 is thus formed in the recess 280.

A process of forming the second conductive material layer includes a deposition process such as a chemical vapor deposition process, a physical vapor deposition process, or an atomic layer deposition process.

The second conductive structure 290 is made of metal such as tungsten, cobalt, titanium or nickel. In one embodiment, the second conductive structure 290 is made of tungsten.

A minimum distance between the sidewall of the first-groove bottom part 262 and the sidewall of the first-groove top part 261 is greater than zero. A minimum distance between the first conductive structure and the second conductive structure is the minimum distance between the sidewall of the first-groove top part 261 and the sidewall of the first-groove bottom part 262. Accordingly, a size of the subsequently formed dielectric layer between the first conductive structure and second conductive structures is greater than zero. Thus, the first conductive structure and the second conductive structure are isolated.

The minimum distance between the first conductive structure and the second conductive structure may be adjusted by controlling the distance between the sidewall of the first-groove top part 261 and the sidewall of the first-groove bottom part 262. Thus, electrical leakage between the first conductive structure and the second conductive structure may be prevented. Meanwhile, an insulating layer is formed at the first-groove top part, and the insulating layer covers a top surface of the first conductive structure. Accordingly, short-circuiting between the first conductive structure and the second conductive structure may be prevented, and performance of the semiconductor device may thus be improved.

The present disclosure also provides a semiconductor device formed by the above disclosed processes and methods. Referring to FIG. 16, the semiconductor device includes a substrate 200, and first gate structures 210 and source/drain doped layers 250 on the substrate 200. The source/drain doped layers 250 are located at two sides of the first gate structures 210. The semiconductor device also includes a dielectric layer 230 on the substrate 200. The dielectric layer 230 covers the first gate structures 210 and the source/drain doped layers 250. The semiconductor device also includes first grooves in the dielectric layer 230, exposing the source/drain doped layers 250. The first groove includes a first-groove bottom part 262 and a first-groove top part 261 on the first-groove bottom part 262. A size of the first-groove top part 261 is larger than a size of the first-groove bottom part 262, and a sidewall of the first-groove top part 261 is recessed more into the dielectric layer with respect to the sidewall of the first-groove bottom part 262. The semiconductor structure also includes a first conductive structure 271 located in the first-groove bottom part 262, and an insulating layer 204 located in the first-groove top part 261. The insulating layer 204 and the dielectric layer are made of different materials. The semiconductor device also includes a second conductive structure 290 located in the dielectric layer 230 and connected to the first gate structure 210.

As disclosed, the technical solutions of the present disclosure have the following advantages.

In the method of forming a semiconductor device provided by the present disclosure, a first groove includes a first-groove top part and a first-groove bottom part. A sidewall of the first-groove bottom part is recessed relative to a sidewall of the first-groove top part, and thus a minimum distance between the sidewall of the first-groove bottom part 262 and the sidewall of the first-groove top part 261 is greater than zero. A first conductive structure is formed in the first-groove bottom part 262, and a second conductive structure is formed in a dielectric layer between the first grooves. A size of the first-groove top part 261 is greater than a size of the first-groove bottom part 262, and a minimum distance between the first conductive structure and the second conductive structure is the minimum distance between the sidewall of the first-groove top part 261 and the sidewall of the first-groove bottom part 262. Accordingly, a size of the dielectric layer between the first conductive structure and the second conductive structures is greater than zero, and thus the first conductive structure and the second conductive structure may be isolated.

The minimum distance between the first conductive structure and the second conductive structure may be adjusted by controlling the distance between the sidewall of the first-groove top part 261 and the sidewall of the first-groove bottom part 262. Accordingly, electrical leakage between the first conductive structure and the second conductive structure may be prevented.

Meanwhile, an insulating layer is formed at the first-groove top part, and the insulating layer covers a top surface of the first conductive structure. Accordingly, short-circuiting between the first conductive structure and the second conductive structure may be prevented, and performance of the semiconductor device may thus be improved.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this disclosure, such other modifications, equivalents, or improvements to the disclosed embodiments are intended to be encompassed within the scope of the present disclosure.

What is claimed is:
1. A semiconductor device, comprising:
   a substrate;
   a first source/drain doped layer and a second source/drain doped layer on the substrate, wherein the first source/drain doped layer is spaced apart from the second source/drain doped layer;

a first conductive structure formed on the substrate and the first source/drain doped layer;

a second conductive structure formed on the substrate and the second source/drain doped layer, wherein the second conductive structure is spaced apart from the first conductive structure;

a first dielectric layer formed on the substrate, the first source/drain doped layer, and the second source/drain doped layer, and covering sidewalls of the first conductive structure and the second conductive structure, a top surface of the first dielectric layer being lower than a top surface of the first conductive structure and a top surface of the second conductive structure;

an insulating layer formed on the first conductive structure and the second conductive structure, wherein the insulating layer and the first dielectric layer are made of different materials, and a width of the insulating layer is larger than a width of the first conductive structure and a width of the second conductive structure;

a second dielectric layer formed on the first dielectric layer except a portion of the top surface of the first dielectric layer that is located between the first conductive structure and the second conductive structure, wherein a top surface of the second dielectric layer is coplanar with a top surface of the insulating layer, and the second dielectric layer and the first dielectric layer are made of a same material; and a third conductive structure formed on the portion of the top surface of the first dielectric layer that is located between the first conductive structure and the second conductive structure.

2. The semiconductor device according to claim 1, wherein the first dielectric layer is made of a material including silicon oxide, silicon nitride, silicon borohydride, nitrogen silicon oxycarbide, silicon oxynitride, or a combination thereof.

3. The semiconductor device according to claim 1, wherein the insulating layer is made of a material including silicon carbide, silicon nitrocarbide, silicon oxycarbide, or a combination thereof.

4. The semiconductor device according to claim 1, wherein a shortest difference between the width of the insulating layer and the width of the first conductive structure is in a range of approximately 5 nm to 20 nm.

5. The semiconductor device according to claim 1, wherein a distance between a sidewall of the insulating layer and a sidewall of the first conductive structure is in a range of approximately 2.5 nm to 20 nm.

6. The semiconductor device according to claim 1, wherein a ratio of a depth of the insulating layer to a depth of the first conductive structure is in a range of approximately 1:3-1:7.

7. The semiconductor device according to claim 6, wherein the depth of the insulating layer is in a range of approximately 150 angstroms to 300 angstroms.

8. The semiconductor device according to claim 1, wherein:
the substrate includes adjacent device regions;
the adjacent device regions have a first fin and a second fin, respectively; and
the first source/drain doped layer is on the first fin, and the second source/drain doped layer is on the second fin.

9. The semiconductor device according to claim 1, wherein a sidewall of the insulating layer is in parallel with the sidewalls of the first conductive structure and the second conductive structure.

10. The semiconductor device according to claim 1, wherein a portion of a top surface and a sidewall surface of the first source/drain doped layer are covered by the first conductive structure, and another portion of the top surface and another sidewall surface of the first source/drain doped layer are covered by the first dielectric layer.

11. The semiconductor device according to claim 1, wherein:
the third conductive structure has a top surface coplanar with the top surface of the insulating layer, and a sidewall surface of the third conductive structure being in parallel with a sidewall of the insulating layer and isolated from the sidewall of the insulating layer by the second dielectric layer.

* * * * *